(12) United States Patent
Lee et al.

(10) Patent No.: US 8,127,674 B2
(45) Date of Patent: Mar. 6, 2012

(54) STAMP AND FABRICATING METHOD THEREOF, THIN FILM TRANSISTOR USING THE STAMP, AND LIQUID CRYSTAL DISPLAY DEVICE HAVING THE THIN FILM TRANSISTOR

(75) Inventors: Bo Hyun Lee, Seoul (KR); Gee Sung Chae, Inchun-si (KR)

(73) Assignee: LG Display Co., Ltd., Seoul (KR)

( * ) Notice: Subject to any disclaimer, the term of this patent is extended or adjusted under 35 U.S.C. 154(b) by 711 days.

(21) Appl. No.: 11/444,182

(22) Filed: May 31, 2006

(65) Prior Publication Data

US 2007/0107614 A1    May 17, 2007

(30) Foreign Application Priority Data

Nov. 14, 2005    (KR) .................. 10-2005-0108334

(51) Int. Cl.
*B41L 47/02*    (2006.01)
(52) U.S. Cl. ..................................... 101/368; 101/401.1
(58) Field of Classification Search .................. 427/457; 264/435, 436; 101/368, 401.1; 977/887
See application file for complete search history.

(56) References Cited

U.S. PATENT DOCUMENTS 6,458,426 B1    10/2002 Bulovic et al.
(Continued)

FOREIGN PATENT DOCUMENTS

CN    1573999 A    2/2005
(Continued)

OTHER PUBLICATIONS

Search Report for corresponding United Kingdom Patent Application No. 0611793.1.
Barry et al., "Printing Nanoparticles from the Liquid and Gas Phases Using Nanoxerography", *Nanotechnology*, 14, pp. 1057-1063, 2003.
(Continued)

*Primary Examiner* — Joshua D Zimmerman
*Assistant Examiner* — Shema Freeman
(74) *Attorney, Agent, or Firm* — Brinks Hofer Gilson & Lione

(57) ABSTRACT

Provided are a method of fabricating a stamp, a thin film transistor and a liquid crystal display device using the same. The stamp has an improved contact property with respect to a substrate. A charged zone is formed on the substrate using the stamp, and nano material charged with opposite charges to those of the charged zone is coated or plated to form a self-assembled monolayer (SAM). Therefore, the thin film transistor and the liquid crystal display device can have precise nano patterns, thereby improving the performance of the device.

15 Claims, 20 Drawing Sheets

U.S. PATENT DOCUMENTS

| | | | |
|---|---|---|---|
| 2004/0028875 A1* | 2/2004 | Van Rijn et al. | 428/98 |
| 2005/0039618 A1 | 2/2005 | Heidari et al. | |
| 2005/0123687 A1 | 6/2005 | Jacobs et al. | |
| 2005/0133954 A1 | 6/2005 | Homola | |
| 2006/0254440 A1* | 11/2006 | Choi et al. | 101/180 |
| 2010/0071100 A1* | 3/2010 | Faris | 850/57 |

FOREIGN PATENT DOCUMENTS

| | | |
|---|---|---|
| CN | 1672100 A | 9/2005 |
| JP | 03-078134 | 4/1991 |
| WO | WO 02/03142 | 1/2002 |
| WO | WO 02/03142 A2 | 1/2002 |

OTHER PUBLICATIONS

Kang et al., "Nanoparticle Pattern Deposition from Gas Phase Onto Charged Flat Surface", *Microelectronic Engineering*, 71, pp. 229-236, 2004.

Search Resort for correspondin• United Kingdom Patent Application No. 0611793.1.

Office Action issued in corresponding Chinese Patent Application No. 200610087175.6; issued Jun. 26, 2009.

Copy of Office Action issued in corresponding Japanese Patent Application No. 2006-167772; issued Sep. 14, 2010.

* cited by examiner

STAMP AND FABRICATING METHOD THEREOF, THIN FILM TRANSISTOR USING THE STAMP, AND LIQUID CRYSTAL DISPLAY DEVICE HAVING THE THIN FILM TRANSISTOR The present application claims the benefit of Korean Patent Application No. 2005-108334 filed in Korea on Nov. 14, 2005, which is hereby incorporated by reference.

FIELD

The present invention relates to a stamp and a fabricating method thereof, a thin film transistor using the stamp, and a liquid crystal display device having the thin film transistor, and more particularly, to a stamp with an improved contact property with respect to a substrate, a thin film transistor having precise nano patterns using the same, and a liquid crystal display device having the thin film transistor.

BACKGROUND

As semiconductor products are miniaturized and highly integrated, researches on patterning technology have been made to form patterns for improving new functions of the devices.

Specifically, microelectronic circuit, digital storage unit, display, and sensor having nano devices of 100 nm or less can obtain excellent characteristics using a very small amount of nano material. Therefore, in various industry fields, nano material is considered as new material that can meet the demands of high-tech industry fields. In the development of such nano devices, one of the most important technologies is the nano patterning technology.

The patterning technology with high integration has been developed as the core technology in fabricating semiconductor devices. Generally, the patterning technology using optics or beam includes a photo lithography, an electron-beam lithography, an X-ray lithography, and so on. Such a lithography process uses photoresist sensitive to the irradiation of light and forms patterns using an etching technique. Accordingly, a conventional lithography technology is time-consuming, cost-consuming and complicated in terms of the apparatus and process.

Also, polymer materials used as the photoresist have reached physical limitation and are difficult to apply to a curved surface.

In recent years, soft-lithography technique has been proposed as a new concept of patterning technology, which is different from the typical optical lithography technology.

The soft-lithography technique includes a microcontact printing (μ CP) and a nano-imprinting lithography. The soft-lithography technique is to fabricate patterns or structures using a flexible polymer stamp to which organic material is applied, without using light or high-energy particles.

According to the microcontact printing (μ CP) using a self-assembled material, ink (self-assembled monolayer (SAM)) is applied to a PolyDiMethylSiloxane (PDMS) elastomer stamp with micron patterns, and patterns are transferred onto a surface of a substrate after contact of the stamp with the surface. In this manner, desired thin film patterns can be locally formed on a plane.

Also, when forming conductive patterns of semiconductor devices or display devices, a stamp is formed by coating a desired metal on a polymer material, such as PDMS, having convex portions (凸), and the stamp is placed on a conductive substrate. Then, an external voltage is applied to form a charged zone with charges on the substrate contacting the convex portions of the metal-coated stamp. Particles or molecules charged with opposite charges to those of the charged zone are coated on the charged zone, and the self-assembled monolayer (SAM) is locally patterned on the plane, thereby directly forming the desired thin film patterns.

However, the stamp formed by coating the metal on the flexible PDMS material is rigid due to the presence of the metal. Therefore, when the charged zone is formed by contacting the stamp with the large-sized substrate so as to form the conductive patterns, it is impossible to properly contact the substrate with the stamp.

Since such a charged zone is not properly matched with the desired pattern region, it is difficult to properly form the conductive patterns in the large-sized substrate. Further, patterns may be opened at each step of the subsequent processes.

SUMMARY

Accordingly, the present invention is directed to a stamp and a fabricating method thereof, a thin film transistor using the stamp, and a liquid crystal display device having the thin film transistor that substantially obviate one or more problems due to limitations and disadvantages of the related art.

A stamp comprises a base substrate and a metal layer that has a convex portion on the substrate. The stamp further comprises a polymer layer formed on the metal layer and on which convex patterns are formed along the convex portion of the metal layer.

In another aspect of the present invention, a method of fabricating a stamp comprises forming a metal layer on a base substrate and patterning the metal layer to form a convex portion thereon. The method of fabricating a stamp further comprises forming a polymer material layer that has convex patterns along the convex portion on the metal layer and hardening the polymer material layer.

In a further aspect of the present invention, a method of forming patterns comprise contacting a stamp with a substrate in which a charged layer is formed and forming a charged zone in the charged layer by applying a predetermined voltage to the stamp. The method of forming patterns further comprise detaching the stamp from the substrate and coating or plating a nano material charged with opposite charges to those of the charged zone. The method of forming patterns further includes forming self-assembled patterns in the charged zone.

In a further aspect of the present invention, a method of forming at least one of a semiconductor layer, a source electrode, a drain electrode, and a gate electrode in a thin film transistor includes forming a charged layer on the substrate, forming a charged zone in a predetermined portion of the charged layer and forming patterns of self-assembled nano material in the charged zone.

In a further aspect of the present invention, a method of fabricating a liquid crystal display device includes self-assembling nano material to form at least one of a gate electrode, a semiconductor layer, source and drain electrodes, and a pixel electrode on a substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

FIGS. 1A to 1G are sectional views illustrating a stamp and a fabricating method thereof according to an embodiment of the present invention.

Figure 1A:
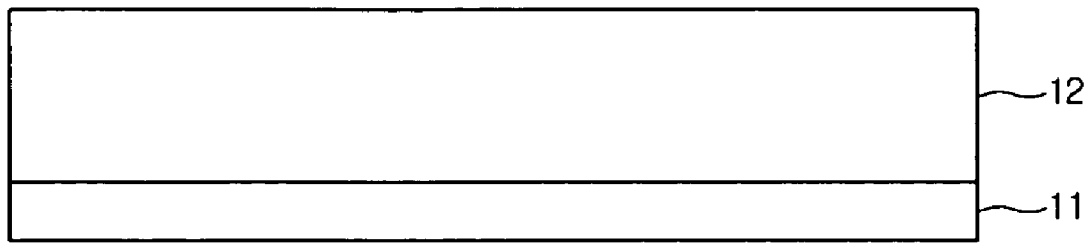
FIGS. 1A to 1G are sectional views illustrating a stamp and a fabricating method thereof according to an embodiment of the present invention.
Figure 1B:
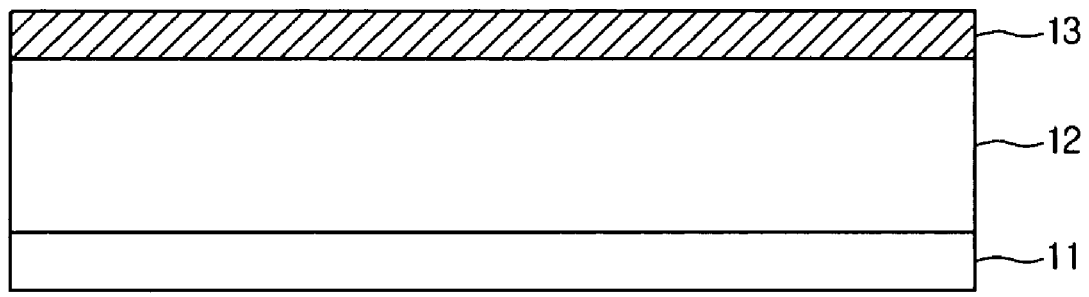
Figure 1C:
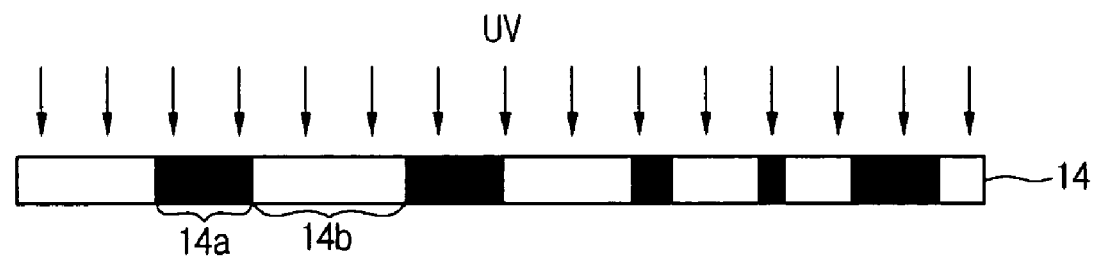
Figure 1C:
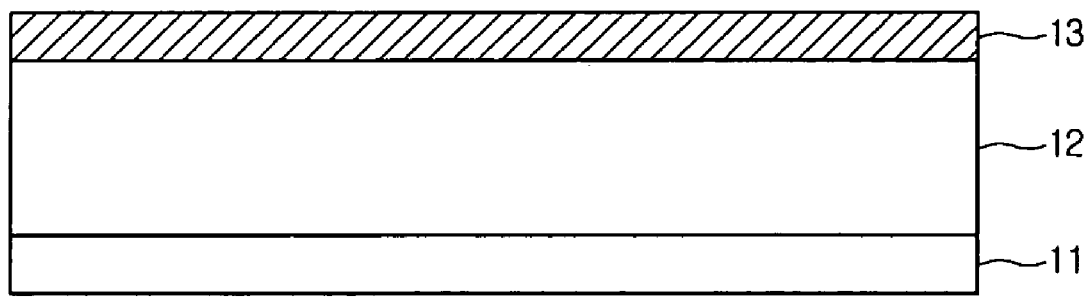
Figure 1D:
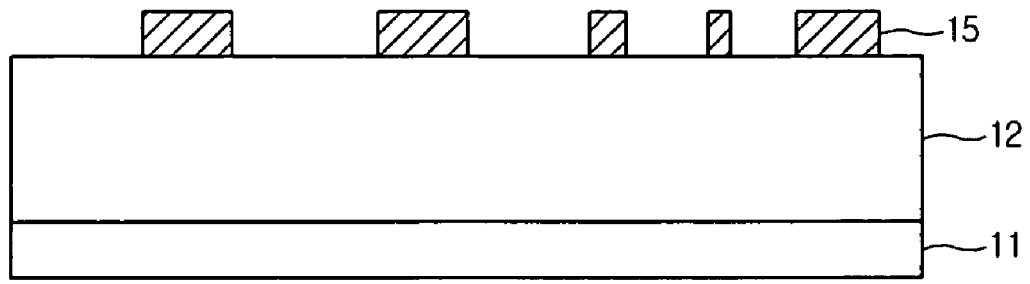
Figure 1E:
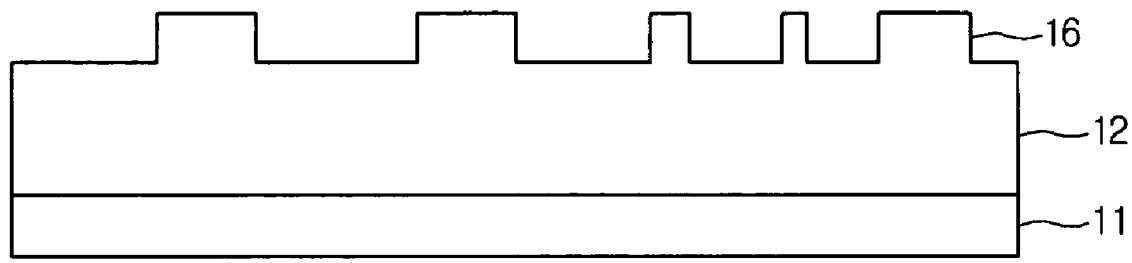
Figure 1F:
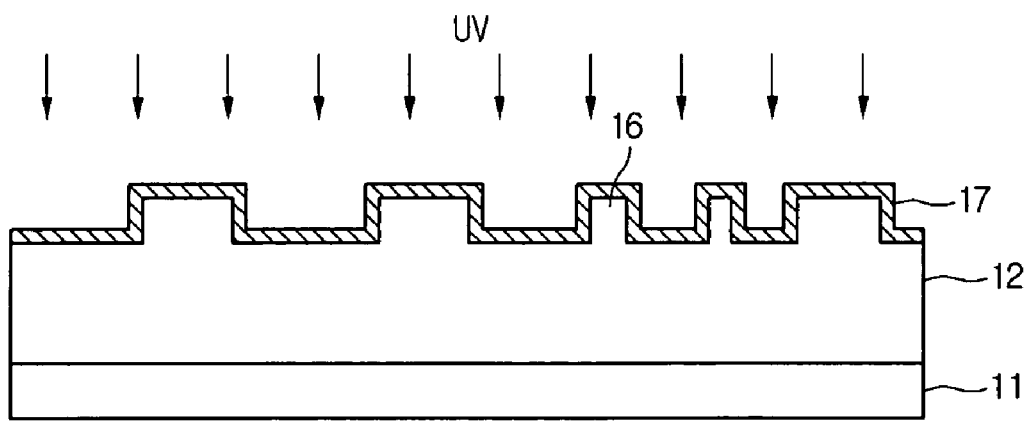
Figure 1G:
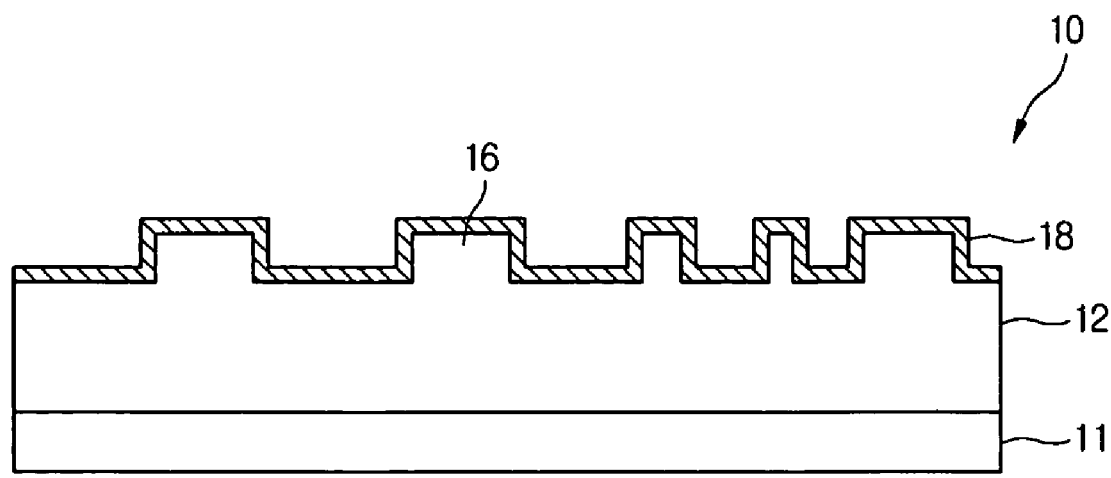

Referring to FIG. 1G, a stamp 10 according to the present invention includes a metal layer 12 with convex portions (⌢) 16 formed on a glass substrate 11, and a polymer layer 18 formed on the metal layer 12.

The metal layer 12 is formed of a conductive metal selected from the group consisting of aluminum (Al), copper (Cu), chrome (Cr), tungsten (W), nickel (Ni), titanium (Ti), and aluminum alloy (AlNd).

The polymer layer 18 is formed of a polymer material including PolyDiMethylSiloxane (PDMS) or Poly Methyl Meta Acrylate (PMMA).

The convex portions 16 formed on the metal layer 12 may have the same size or different sizes. Also, the convex portions 16 may be modified according to the desired pattern shape.

A method of fabricating a stamp according to the present invention will be described below with reference to FIGS. 1A to 1G.

Referring to FIG. 1A, a metal layer 12 is formed by depositing a metal on an entire surface of a substrate 11 using plasma enhanced chemical vapor deposition (PECVD), low pressure chemical vapor deposition (LPCVD), or sputtering.

Referring to FIG. 1B, a photoresist (PR) 13, a photosensitive material, is coated on the metal layer 12 using spin coating. The photoresist 13 may be a positive type photoresist or a negative type photoresist. In this embodiment, the photoresist 13 is the positive type photoresist in which only a region exposed to ultraviolet (UV) light is removed by a developer in a developing process.

Referring to FIG. 1C, a mask 14 having a light shielding portion 14a and a light transmitting portion 14b is placed above the photoresist 13, and UV light is irradiated on the mask.

Referring to FIG. 1D, the photoresist 13 is developed by the UV light passing through the light transmitting portion 14b of the mask 14, and a portion of the photoresist 13 corresponding to the light transmitting portion 14b is removed. Consequently, photoresist patterns 15 are formed in a region corresponding to the light shielding portion 14a of the mask 14.

Referring to FIG. 1E, the metal layer 12 is dry etched using the photoresist patterns 15 as a mask. Then, the metal layer 12 having convex portions 16 are formed by removing the photoresist patterns 15 using ashing or PR stripping.

Referring to FIG. 1F, a polymer layer 17 is formed by coating or depositing a liquid PMMA or PDMS on the metal layer 12 with the convex portions 16 by using one of spin coating, slit coating, spray deposition, and Langmuir Blodgett method. Then, the polymer layer 17 is hardened using UV light or heat.

Referring to FIG. 1G, through the above procedures, a stamp 10 having the polymer layer 18 on the metal layer 12 with the convex portions 16 is formed.

As described above, the surface of the convex portions 16 is formed of the flexible polymer layer, such as PDMS and PMMA. Therefore, when a charged zone will be formed in contact with a large-sized substrate in a following process, the contact property with respect to the substrate is so excellent that a precise charged zone identical to the desired patterns can be formed during an initial deposition.

FIGS. 2A to 2E are sectional views illustrating a method of forming nano patterns using the stamp according to a first embodiment of the present invention, and FIGS. 3A to 3F are sectional views illustrating a method of forming nano patterns using the stamp according to a second embodiment of the present invention.

Figure 2A:
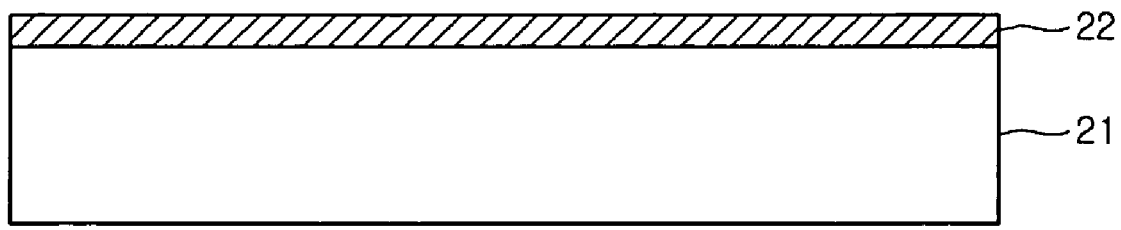
FIGS. 2A to 2E are sectional views illustrating a method of forming nano patterns using the stamp according to a first embodiment of the present invention.

Referring to FIG. 2A, a charged layer 22 is formed on a substrate 21.

The substrate 21 may be formed of transparent or opaque material. Also, the substrate 21 may be a conductive or non-conductive substrate. The substrate 21 may be formed of glass or silicon (Si).

The charged layer 22 is formed of dielectric material. The charged layer 22 may be formed of PDMS or PMMA.

The charged layer 22 is formed by coating or depositing liquid dielectric material using one of spin coating, slit coating, spray deposition, and Langmuir Blodgett method and then hardening the coated or deposited dielectric material using UV light or heat.

Figure 2B:
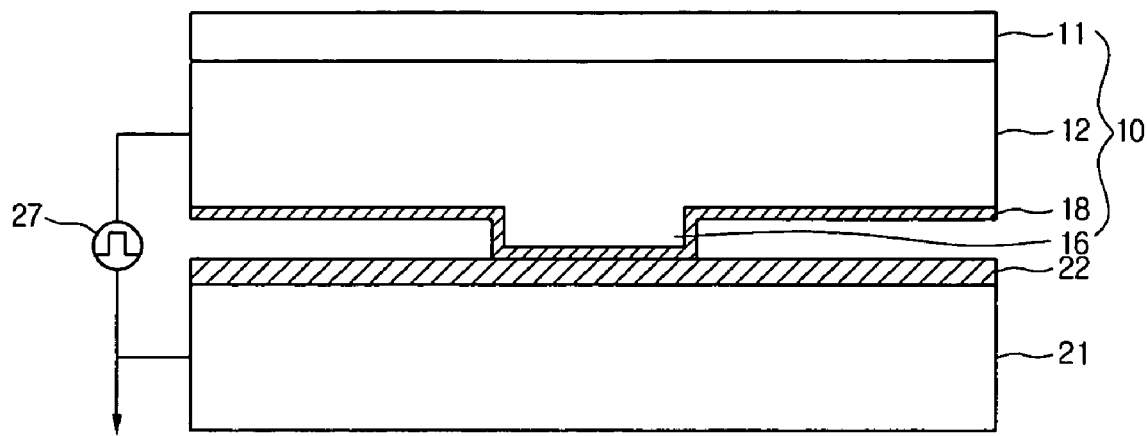

Referring to FIG. 2B, the charged layer 22 is brought into contact with the stamp 10, which includes the glass substrate 11, the metal layer 12 with the convex portions 16, and the polymer layer 18. Then, an external voltage 27 is applied to the metal layer 12 of the stamp 10 and the substrate 21. The substrate 21 is a conductive substrate.

Although not shown, in case where the substrate 21 is a non-conductive substrate, a conductive metal substrate is placed under the non-conductive substrate 21 or held in vacuum state. Then, an external voltage is applied to the metal layer 12 of the stamp 10 and the conductive metal substrate, or the substrate 21 is inserted into a sputtering chamber. Thereafter, a predetermined voltage is applied to the metal layer 12 of the stamp 10 and a conductive metal substrate such that charges can move toward the charged layer 22. Through these procedures, the charged zone is formed.

Figure 2C:
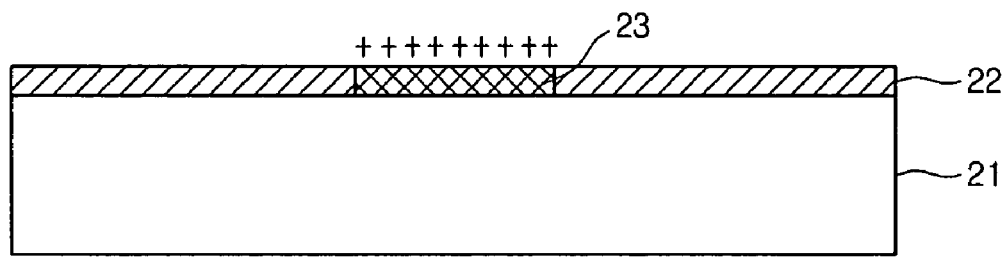

Referring to FIG. 2C, by detaching the stamp 10 from the charged layer 22, the charged zone 23 charged with negative (−) charges or positive (+) charges is formed in the contact region between the polymer layer 18 of the convex portion 16 of the stamp 10 and the charged layer 22. In this embodiment, the charged zone 23 is charged with positive charges.

Figure 2D:
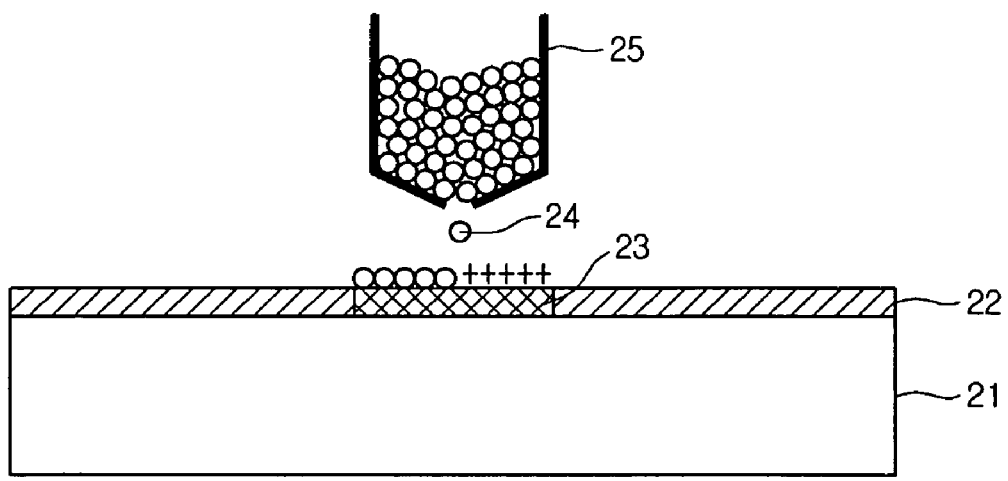

Referring to FIG. 2D, nano material 24 charged with negative charges is coated using a nozzle 25 in a printer toner method.

The printer toner method is performed at room temperature. Since the printer toner scheme is well known, its detailed description will be omitted.

The nano material 24 is a nano powder and is formed of one selected from the group consisting of silicon (Si), gold (Au), silver (Ag), and copper (Cu).

Figure 2E:
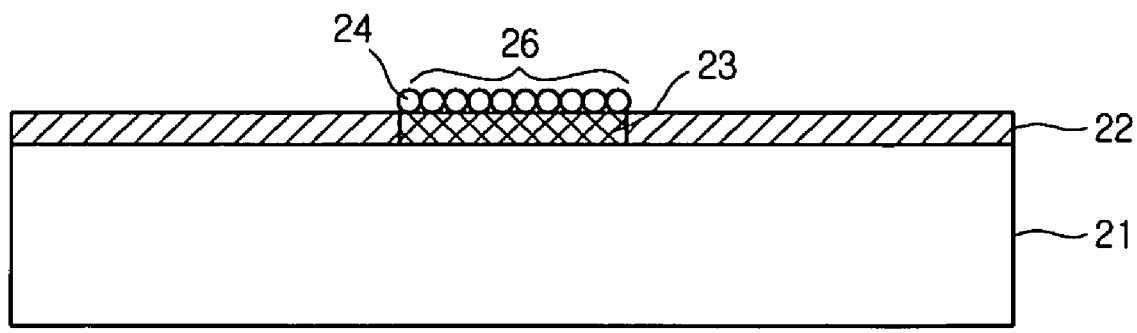

Referring to FIG. 2E, the coated nano powder 24 forms a self-assembled monolayer (SAM) on the charged zone 23 due to the attractive force, thereby forming nano patterns 26.

The nano patterns 26 may be used as a semiconductor layer, a gate electrode, source and drain electrode patterns. Since the nano patterns 26 improves the contact property with respect to the charged layer 22 using the flexible stamp of the present invention, the charged zone 23 with the excellent patterning property is formed within the charged layer 22. Thus, the excellent nano thin film identical to the desired patterns can be formed during the initial deposition.

A method of forming nano patterns using the stamp according to a second embodiment of the present invention will be described below with reference to FIGS. 3A to 3F.

Figure 3A:
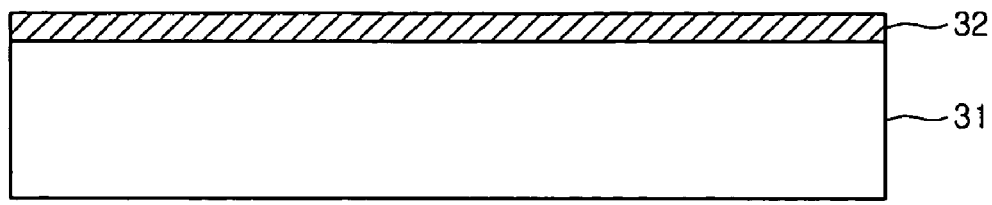
FIGS. 3A to 3F are sectional views illustrating a method of forming nano patterns using the stamp according to a second embodiment of the present invention.

Referring to FIG. 3A, a charged layer 32 is formed on a substrate 31. The materials of the substrate 31 and the charged layer 32 and the method of forming the charged layer 32 are equal to those of first embodiment.

Figure 3B:
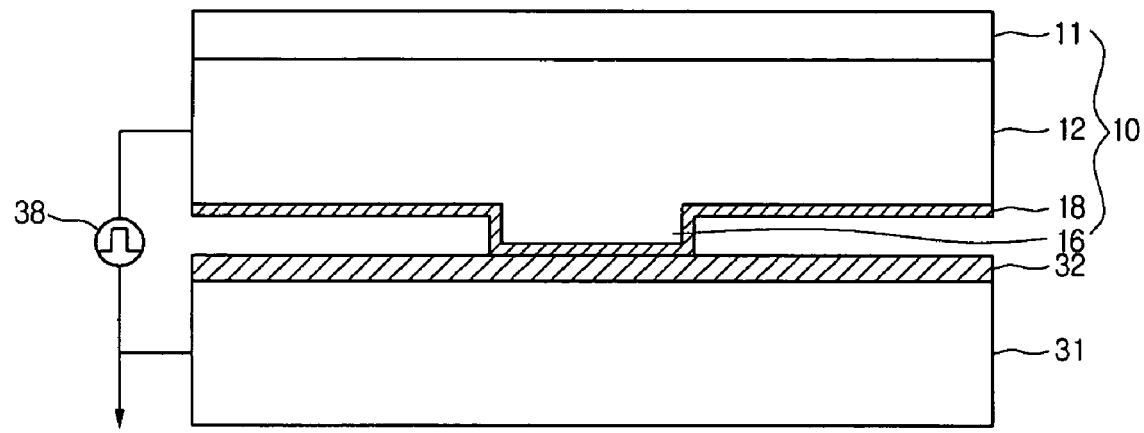

Referring to FIG. 3B, the charged layer 32 is brought into contact with the stamp 10, which includes the glass substrate 11, the metal layer 12 with the convex portions 16, and the polymer layer 18. Then, an external voltage 38 is applied to the metal layer 12 of the stamp 10 and the substrate 31. The substrate 31 is a conductive substrate.

Although not shown, in case where the substrate 31 is a non-conductive substrate, the external voltage is applied in the same manner as the first embodiment of the present invention.

Figure 3C:
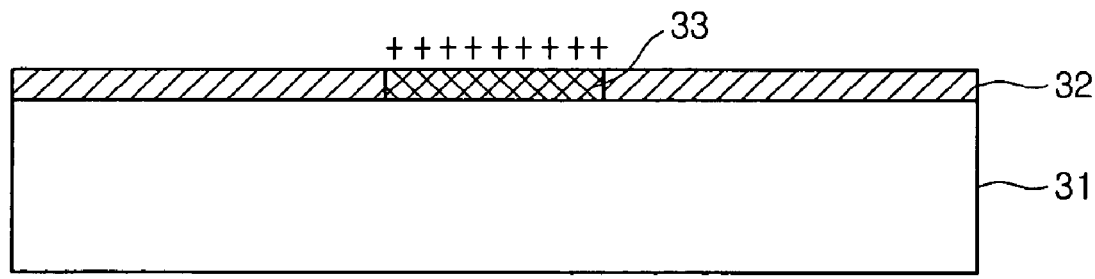

Referring to FIG. 3C, by detaching the stamp 10 from the charged layer 32, the charged zone 33 charged with negative (−) charges or positive (+) charges is formed in the contact region between the polymer layer 18 of the convex portion 16 of the stamp 10 and the charged layer 32. In this embodiment, the charged zone 33 is charged with positive charges.

Then, nano material 34 charged with negative charges is mixed with a solvent to prepare a solution in which the negative charged nano material 24 is dispersed.

The nano material 34 is nano wire or nano tube and is formed of material selected from the group consisting of silicon (Si), gold (Au), silver (Si), and copper (Cu).

There is no special limitation in the organic solvent for dispersing the nano wire or nano tube 34. The organic solvent may be one of ethanol, methanol, and isopropyl alcohol (IPA).

Figure 3D:
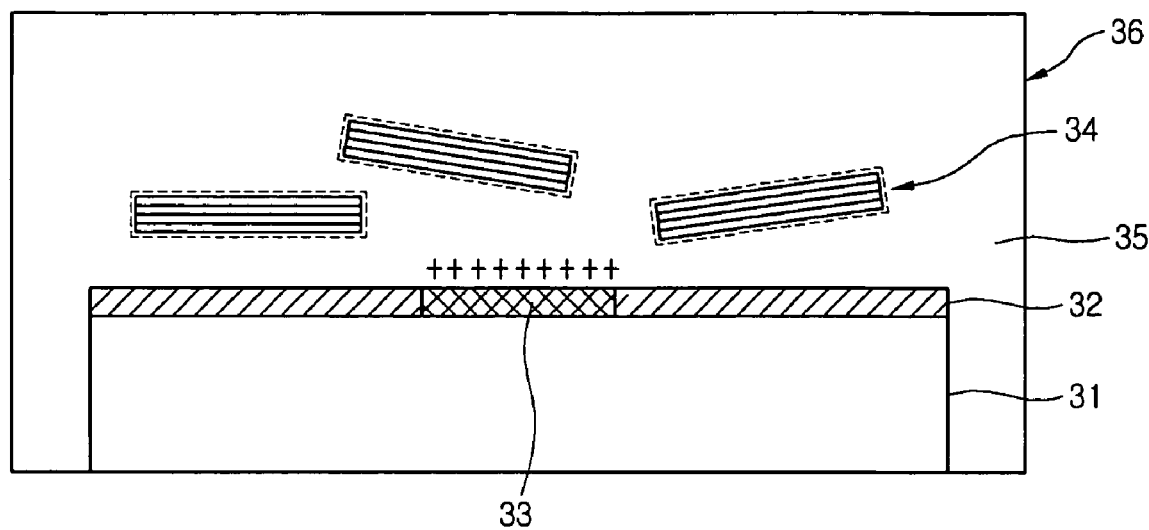

Referring to FIG. 3D, the substrate 31 with the charged zone 33 is placed in a container containing the solution 35.

Figure 3E:
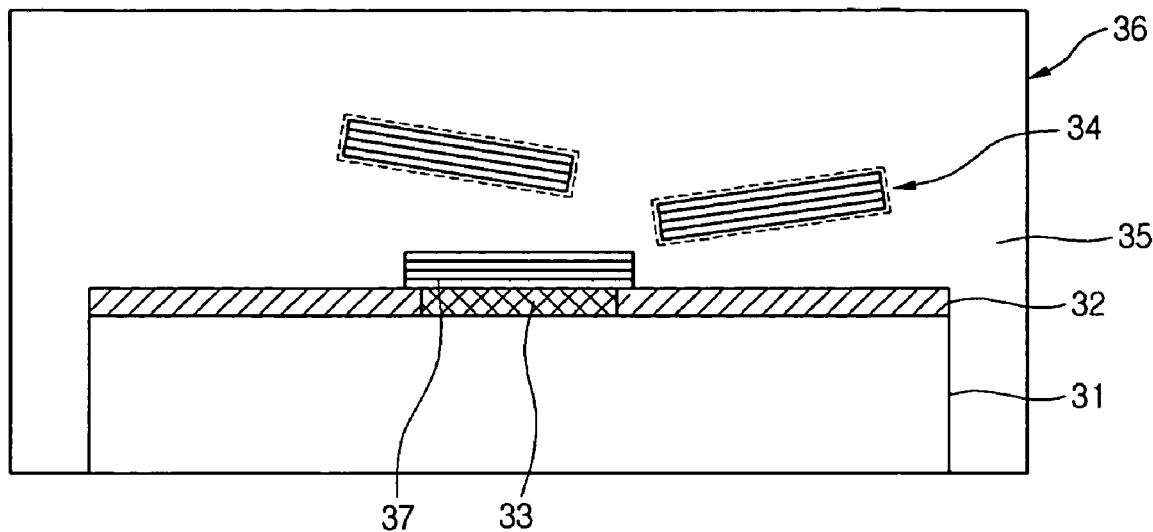

Referring to FIG. 3E, the nano wire or nano tube 34 forms a self-assembled monolayer (SAM) on the charged zone 33 due to the attractive force, thereby forming nano patterns 37. That is, the nano patterns 37 are formed by a plating method.

Figure 3F:
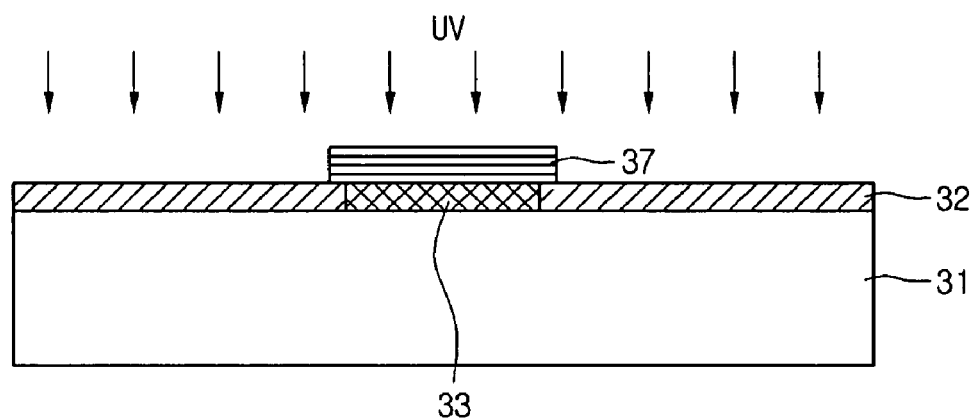

Referring to FIG. 3F, the substrate 31 with the nano patterns 37 is taken out from the solution and dried using UV light or heat.

The nano patterns 37 may be used as a semiconductor layer, a gate electrode, source and drain electrode patterns. Since the nano patterns 37 improves the contact property with respect to the charged layer 32 using the flexible stamp of the present invention, the charged zone 33 with the excellent patterning property is formed within the charged layer 32. Thus, the excellent nano thin film identical to the desired patterns can be formed during the initial deposition.

FIGS. 4A to 4F are sectional views illustrating a method of fabricating a thin film transistor using the stamp according to a first embodiment of the present invention.

Figure 4A:
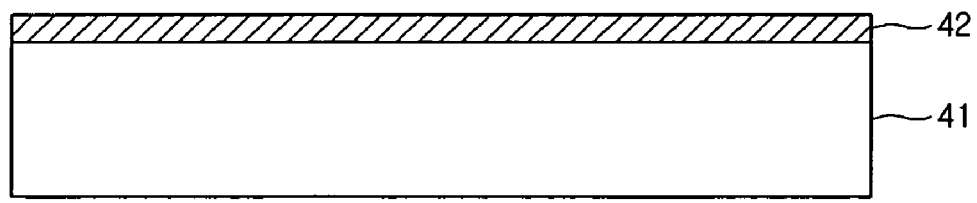
FIGS. 4A to 4F are sectional views illustrating a method of fabricating a thin film transistor using the stamp according to a first embodiment of the present invention.

Referring to FIG. 4A, a charged layer 42 with a charged zone 43 is formed on a substrate 41.

The substrate 41 may be formed of transparent or opaque material. Also, the substrate 41 may be a conductive or non-conductive substrate. The substrate 41 may be formed of glass or silicon (Si).

The charged layer 42 is formed of dielectric material. The charged layer 42 may be formed of PDMS or PMMA.

The charged layer 42 is formed by coating or depositing liquid dielectric material using one of spin coating, slit coating, spray deposition, and Langmuir Blodgett method and then hardening the coated or deposited dielectric material using UV light or heat.

Figure 4B:
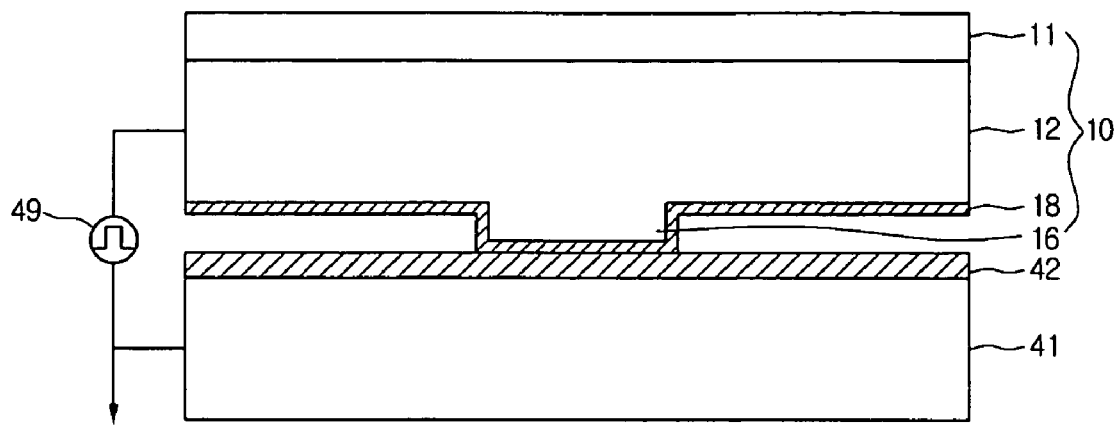

Referring to FIG. 4B, the charged layer 42 is brought into contact with the stamp 10, which includes the glass substrate 11, the metal layer 12 with the convex portions 16, and the polymer layer 18. Then, an external voltage 49 is applied to the metal layer 12 of the stamp 10 and the substrate 41. At this point, only the polymer layer 18 of the convex portions 16 of the stamp 10 is brought into contact with the charged layer 42. The substrate 41 is a conductive substrate.

Although not shown, in case where the substrate 41 is a non-conductive substrate, a conductive metal substrate is placed under the substrate 41 or held in vacuum state. Then, an external voltage is applied to the metal layer 12 of the stamp 10 and the conductive metal substrate, or the substrate 41 is inserted into a sputtering chamber. Thereafter, a predetermined voltage is applied to the metal layer 12 of the stamp 10 and a conductive metal substrate such that charges can move toward the charged layer 42. Through these procedures, the charged zone is formed.

Figure 4C:
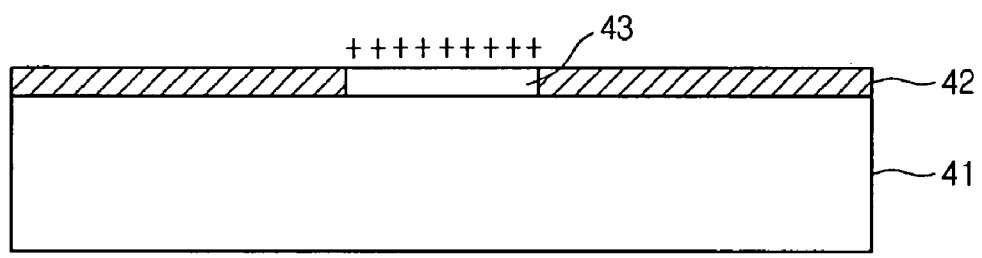

Referring to FIG. 4C, by detaching the stamp 10 from the charged layer 42, the charged zone 43 charged with negative (−) charges or positive (+) charges is formed in the contact region between the polymer layer 18 of the convex portion 16 of the stamp 10 and the charged layer 42. In this embodiment, the charged zone 43 is charged with positive charges.

Figure 4D:
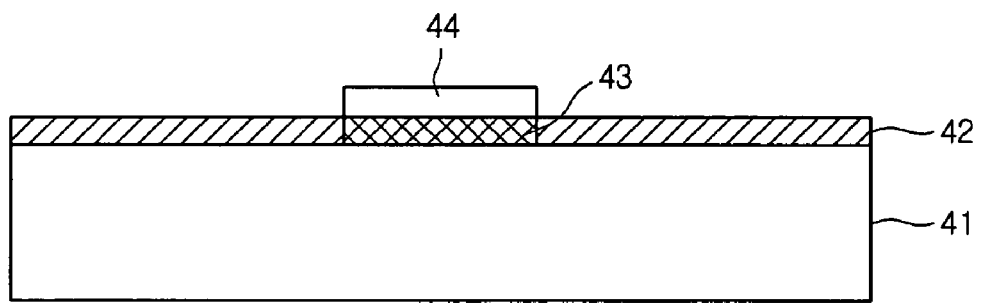

Referring to FIG. 4D, nano powder charged with negative charges is coated on the charged zone 43 using a printer toner method, or the substrate 41 with the charged zone 43 is soaked in a solution in which nano wire or nano tube charged with negative charges is dispersed. Thus, a semiconductor layer 44 is formed on the charged zone 43 in a self-assembled monolayer (SAM) due to the attractive force. At this point, the semiconductor layer 44 is formed using deposition or plating.

That is, the semiconductor layer 44 is formed by the method of forming nano patterns using the stamp according to the first or second embodiment of the present invention.

The semiconductor layer 44 is formed of one of nano powder, nano wire, and nano tube. The semiconductor layer 44 may be formed of silicon.

The solution contains a solvent for dispersing the nano wires or nano tubes. The solvent is an organic solvent and is not specially limited. The organic solvent may be one of ethanol, methanol, and isopropyl alcohol (IPA).

The substrate 41 is soaked in the solution in which the nano wires or nano tubes are dispersed. Then, the substrate 41 is taken out from the solution and dried. At this point, the substrate 41 is dried using UV light or heat.

The semiconductor layer 44 is formed in precise nano patterns due to the self-assembly. The patterns identical to the semiconductor patterns can be formed during the initial deposition.

Figure 4E:
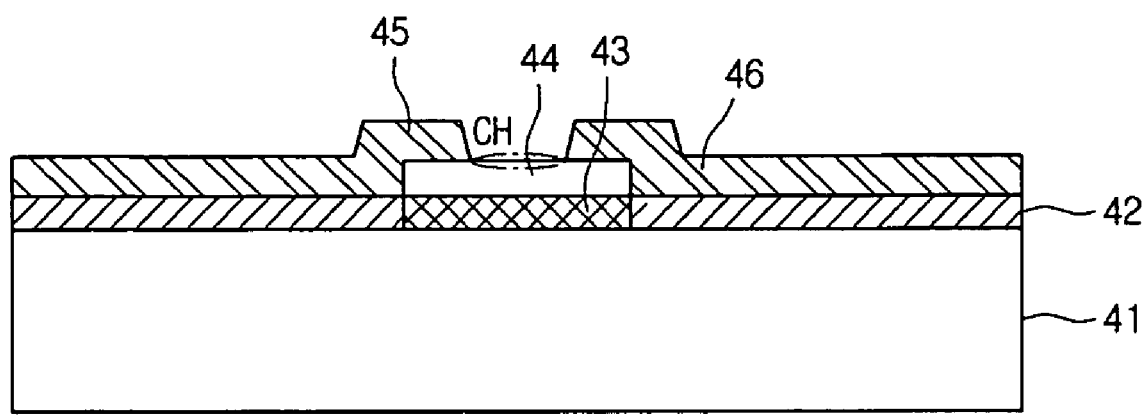

Referring to FIG. 4E, a conductive metal is stacked on the charged layer 42 with the semiconductor layer 44 using PECVD, LPCVD, or sputtering. Then, using a mask, the conductive metal is patterned to form source and drain electrodes 45 and 46 spaced apart from each other by a predetermined distance and connected to the semiconductor layer 44.

The source and drain electrodes 45 and 46 are formed of material selected from the group consisting of aluminum (Al), copper (Cu), chrome (Cr), tungsten (W), nickel (Ni), titanium (Ti), and aluminum alloy (AlNd).

A channel CH is formed to connect the source electrode 45 to the drain electrode 46 in a region where the source and drain electrodes 45 and 46 are spaced apart and the semiconductor layer 44 is exposed.

Figure 4F:
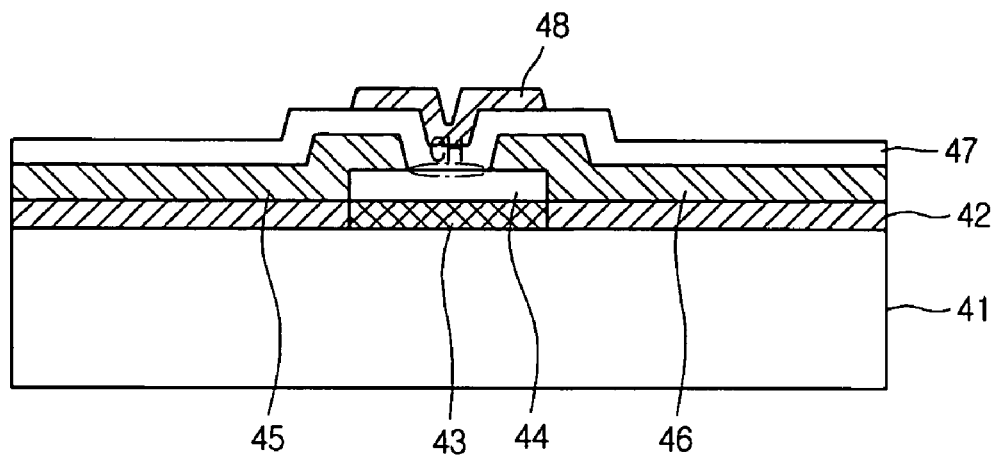

Referring to FIG. 4F, a gate insulating layer 47 is formed by depositing silicon oxide layer ($SiO_2$) or silicon nitride layer (SiNx) on an entire surface of the substrate 41 with the source and drain electrodes 45 and 46 using PECVD or LPCVD.

A conductive metal is stacked on the gate insulating layer 47 using PECVD, LPCVD, or sputtering. Then, using a mask, the conductive metal is patterned to form a gate electrode 48 corresponding to the semiconductor layer 44. The gate electrode 48 is formed of material selected from the group consisting of aluminum (Al), copper (cu), chrome (Cr), tungsten (W), nickel (Ni), titanium (Ti), and aluminum alloy (AlNd).

Through these procedures, a top gate type thin film transistor having the semiconductor layer 44, the source and drain electrodes 45 and 46, and the gate electrode 48 is completed.

The thin film transistor includes the semiconductor layer 44 formed in a precise nano thin film pattern using the stamp 10 according to the present invention.

Using the flexible stamp 10, the thin film transistor improves the contact property between the stamp 10 and the charged layer 42 and thus the charged zone 43 with excellent patterning property is formed within the charged layer 42. Therefore, the semiconductor layer 44 having excellent nano thin film pattern equal to the desired pattern in the initial deposition can be formed during the subsequent procedures, thereby improving the performance of the thin film transistor.

FIGS. 5A to 5F are sectional views illustrating a method of fabricating a thin film transistor using the stamp according to a second embodiment of the present invention.

Figure 5A:
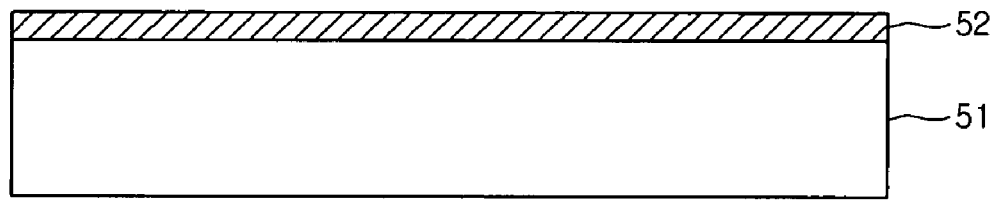
FIGS. 5A to 5F are sectional views illustrating a method of fabricating a thin film transistor using the stamp according to a second embodiment of the present invention.

Referring to FIG. 5A, a charged layer 52 is formed on a substrate 51.

The materials of the substrate 51 and the charged layer 52 and the method of forming the charged layer 52 are equal to those of first embodiment of the present invention.

Figure 5B:
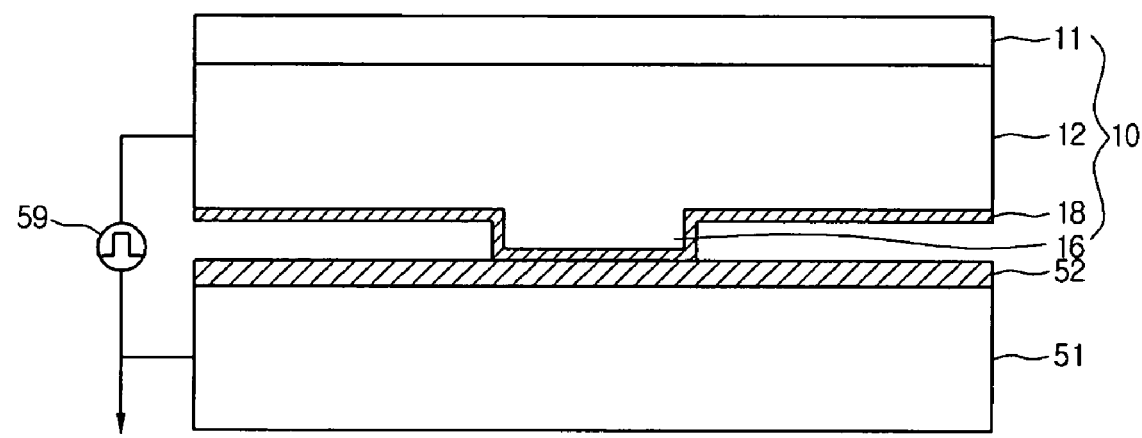

Referring to FIG. 5B, the charged layer 52 is brought into contact with the stamp 10, which includes the glass substrate 11, the metal layer 12 with the convex portions 16, and the polymer layer 18. Then, an external voltage 59 is applied to the metal layer 12 of the stamp 10 and the substrate 51. The substrate 51 is a conductive substrate.

Although not shown, in case where the substrate 51 is a non-conductive substrate, the external voltage is applied in the same manner as in the thin film transistor according to the first embodiment of the present invention.

Figure 5C:
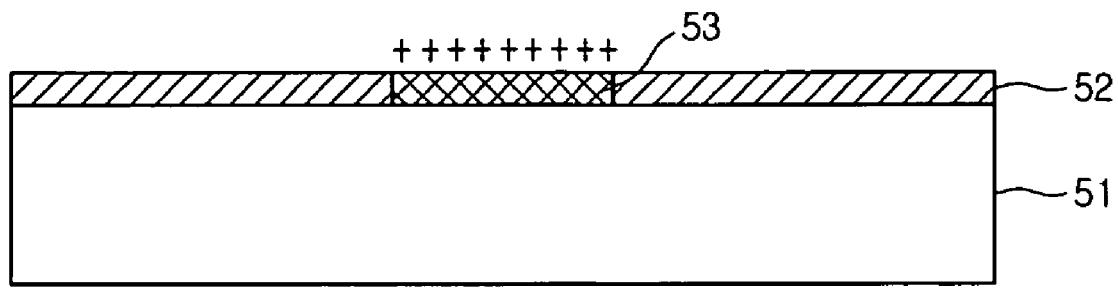

Referring to FIG. 5C, by detaching the stamp 10 from the charged layer 52, the charged zone 53 charged with negative (−) charges or positive (+) charges is formed in the contact region between the polymer layer 18 of the convex portion 16 of the stamp 10 and the charged layer 52. In this embodiment, the charged zone 53 is charged with positive charges.

Figure 5D:
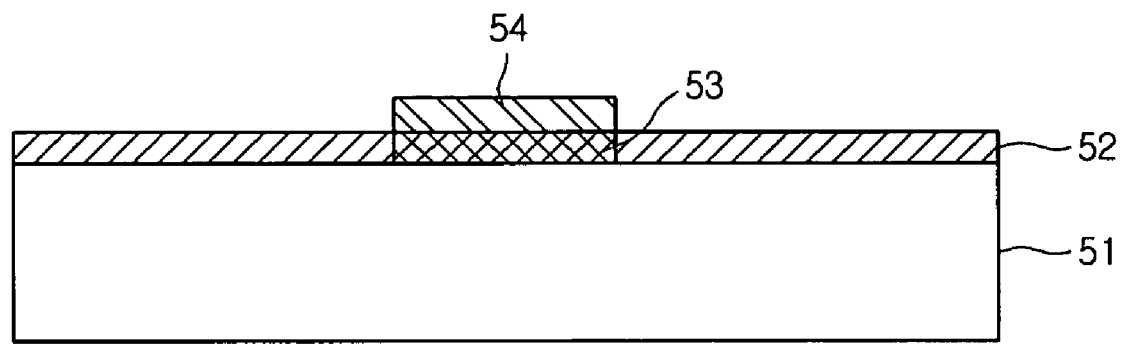

Referring to FIG. 5D, nano powder charged with negative charges is coated on the charged zone 53 using a printer toner method, or the substrate 51 with the charged zone 53 is soaked in a solution in which nano wire or nano tube charged with negative charges is dispersed. Thus, a gate electrode 54 is formed in a self-assembled monolayer (SAM) on the charged zone 53 due to the attractive force. At this point, the gate electrode 54 is formed using deposition or plating.

The gate electrode 54 of the SAM nano patterns is formed by the method of forming nano patterns according to the first or second embodiment of the present invention.

The gate electrode 54 is formed of one of nano powder, nano wire, and nano tube. The gate electrode 54 may be formed of gold (Au), silver (Ag), or copper (Cu).

Figure 5E:
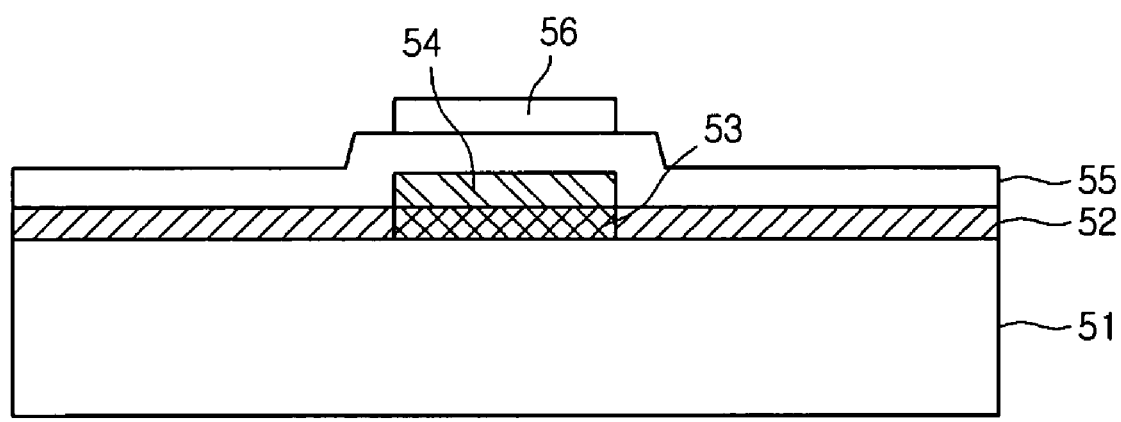

Referring to FIG. 5E, a gate insulating layer 55 is formed by depositing silicon oxide layer or silicon nitride layer on an entire surface of the substrate 51 with the gate electrode 54 using PECVD or LPCVD.

Pure amorphous silicon and impurity-doped amorphous silicon are sequentially stacked on an entire surface of the gate insulating layer 55 using PECVD or LPCVD, and then patterned to form a semiconductor layer 56 in a region corresponding to the gate electrode 54.

Figure 5F:
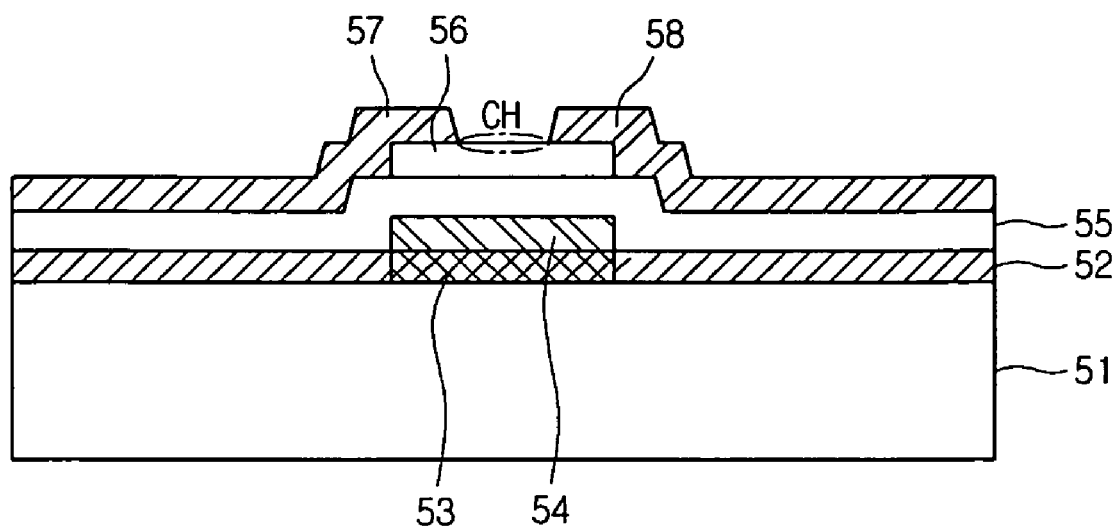

Referring to FIG. 5F, a conductive metal is stacked on the gate insulating layer 55 with the semiconductor layer 56 using PECVD, LPCVD, or sputtering. Then, using a mask, the conductive metal is patterned to form source and drain electrodes 57 and 58 spaced apart from each other by a predetermined distance and connected to the semiconductor layer 56.

The source and drain electrodes 57 and 58 are formed of material selected from the group consisting of aluminum (Al), copper (cu), chrome (Cr), tungsten (W), nickel (Ni), titanium (Ti), and aluminum alloy (AlNd).

A channel CH is formed to connect the source electrode 57 to the drain electrode 58 in a region where the source and drain electrodes 57 and 58 are spaced apart and the semiconductor layer 56 is exposed.

Through these procedures, a bottom gate type thin film transistor having the gate electrode 54, the semiconductor layer 56, and the source and drain electrodes 57 and 58 is completed.

Using the flexible stamp 10, the thin film transistor improves the contact property between the stamp 10 and the charged layer 52 and thus the charged zone 53 with excellent patterning property is formed within the charged layer 52. Therefore, the gate electrode 54 having excellent nano thin film pattern equal to the desired pattern can be formed during the initial deposition, thereby improving the performance of the thin film transistor.

FIGS. 6A to 6F are sectional views illustrating a method of fabricating a thin film transistor using the stamp according to a third embodiment of the present invention.

Figure 6A:
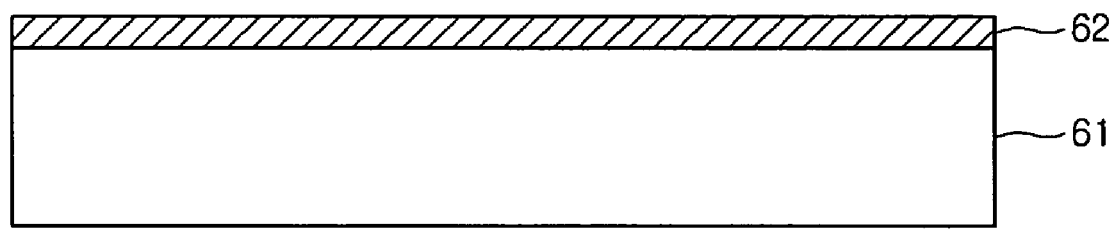
FIGS. 6A to 6F are sectional views illustrating a method of fabricating a thin film transistor using the stamp according to a third embodiment of the present invention.

Referring to FIG. 6A, a charged layer 62 is formed on a substrate 61.

The materials of the substrate 61 and the charged layer 62 and the method of forming the charged layer 62 are equal to those of first embodiment of the present invention.

Figure 6B:
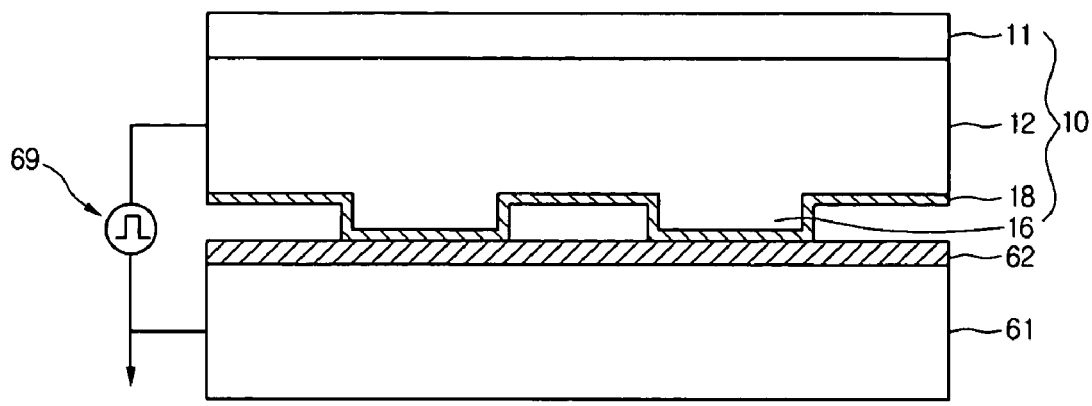

Referring to FIG. 6B, the charged layer 62 is brought into contact with the stamp 10, which includes the glass substrate 11, the metal layer 12 with the convex portions 16, and the polymer layer 18. Then, an external voltage 69 is applied to the metal layer 12 of the stamp 10 and the substrate 61. The substrate 61 is a conductive substrate.

Although not shown, in case where the substrate 61 is a non-conductive substrate, the external voltage is applied in the same manner as in the thin film transistor according to the first embodiment of the present invention.

Figure 6C:
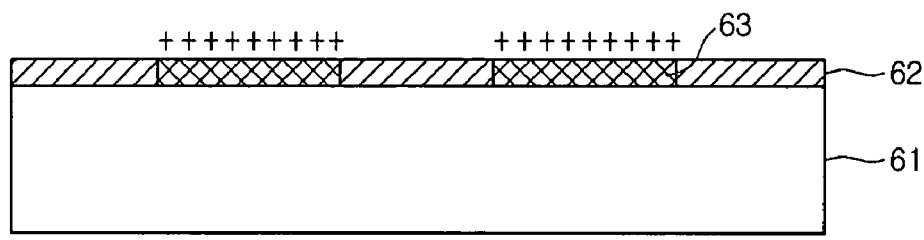

Referring to FIG. 6C, by detaching the stamp 10 from the charged layer 62, the charged zone 63 charged with negative (−) charges or positive (+) charges is formed in the contact region between the polymer layer 18 of the convex portion 16 of the stamp 10 and the charged layer 62. In this embodiment, the charged zone 63 is charged with positive charges.

Figure 6D:
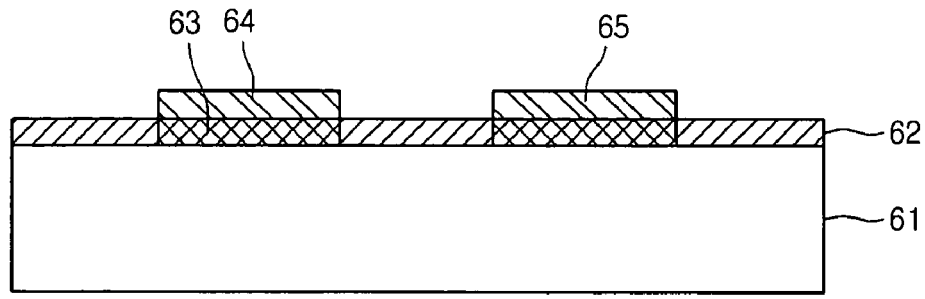

Referring to FIG. 6D, nano powder charged with negative charges is coated on the charged zone 63 using a printer toner method, or the substrate 61 with the charged zone 63 is soaked in a solution in which nano wire or nano tube charged with negative charges is dispersed. Thus, source and drain electrodes 64 and 65 are formed in a self-assembled monolayer (SAM) on the charged zone 63 due to the attractive force. At this point, the source and drain electrodes 64 and 65 are formed using deposition or plating.

The source and drain electrodes 64 and 65 of the SAM nano patterns are formed by the method of forming nano patterns according to the first or second embodiment of the present invention.

The source and drain electrodes 64 and 65 are formed of one of nano powder, nano wire, and nano tube. The semiconductor layer source and drain electrodes 64 and 65 may be formed of gold (Au), silver (Ag), or copper (Cu).

At this point, the source and drain electrodes 64 and 65 are formed as precise nano patterns equal to the desired source and drain electrode patterns during the initial deposition.

Figure 6E:
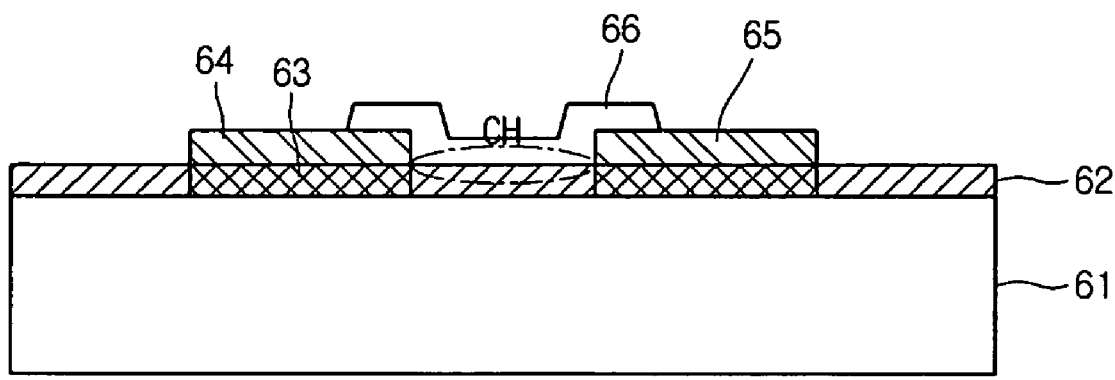

Referring to FIG. 6E, a semiconductor layer 66 is formed between the source and drain electrodes 64 and 65 on the charged layer 62 such that it is connected to the source and drain electrode 64 and 65. A channel CH is formed to connect the source electrode 64 to the drain electrode 65 in a region where the source and drain electrodes 64 and 65 are spaced apart, with the semiconductor layer 66 being interposed therebetween.

The material of the semiconductor layer 66 and the method of forming the same are identical to those of the second embodiment of the present invention.

Figure 6F:
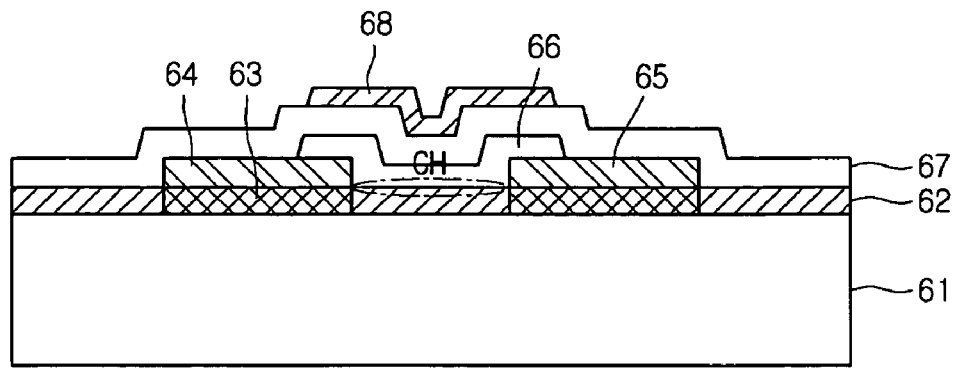

Referring to FIG. 6F, a gate insulating layer 67 is formed on an entire surface of the substrate 61 with the semiconductor layer 66. Then, a conductive metal is stacked on the gate insulating layer 67 and patterned to form a gate electrode 68 corresponding to the semiconductor layer 66.

The materials of the gate insulating layer 67 and the gate electrode 68 and the method of forming the gate electrode 68 are identical to those of the first embodiment of the present invention.

Through these procedures, a top gate type thin film transistor having the source and drain electrodes 64 and 65, the semiconductor layer 66, and the gate electrode 68 is completed.

As described above, one of the semiconductor layer, the gate electrode, and the source and drain electrodes are formed in precise nano patterns using the stamp of the present invention.

More specifically, using the flexible stamp, the thin film transistor improves the contact property between the stamp and the charged layer. Thus, the thin film transistor of the nano thin film patterns equal to the desired semiconductor layer, gate electrode, and source and drain electrodes can be formed during the initial deposition, thereby improving the performance of the thin film transistor.

In the method of the first to third embodiments of the present invention, the charged layer for forming the charged zone is required so as to form the nano patterns using the stamp. Therefore, in order to prevent the performance of the device from being degraded due to the charged layer formed between the electrodes in forming the thin film transistor, only one of the semiconductor layer, the gate electrode, and the source and drain electrode is formed using the method of forming nano patterns using the stamp.

FIG. 7A to 7H are sectional views illustrating a method of fabricating an array substrate of an LCD using the method of fabricating the thin film transistor according to the first embodiment of the present invention.

Figure 7A:
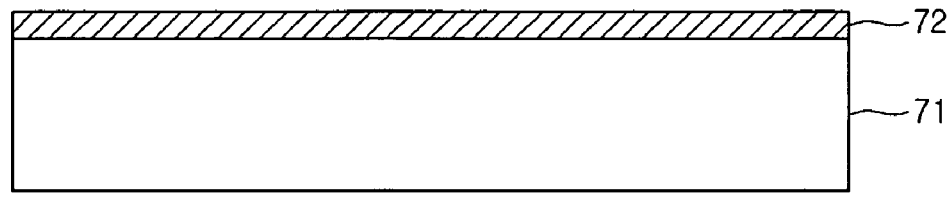
FIGS. 7A to 7H are sectional views illustrating a method of fabricating an array substrate of an LCD using the method of fabricating the thin film transistor according to the first embodiment of the present invention.

Referring to FIG. 7A, a charged layer 72 is formed on a glass substrate 71. The charged layer 72 is brought into contact with the stamp 10, which includes the glass substrate 11, the metal layer 12 with the convex portions 16, and the polymer layer 18. At this point, only the polymer layer 18 of the convex portions 16 of the stamp 10 is brought into contact with the charged layer 72.

Figure 7B:
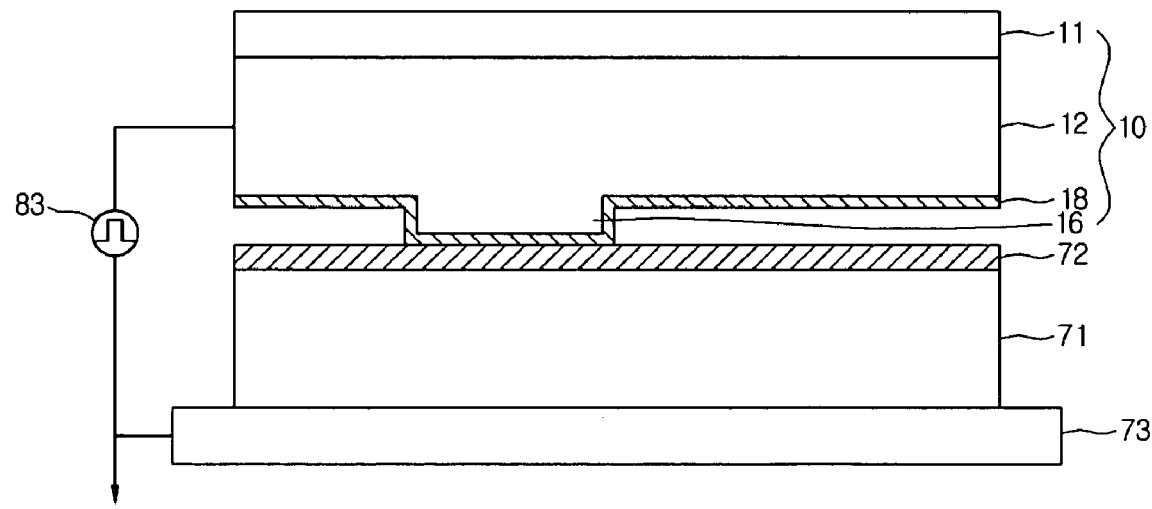

Referring to FIG. 7B, since the glass substrate 71 is non-conductive, a metal substrate 73 is placed under the glass substrate 71 or held in a vacuum state. Then, an external voltage 83 is applied to the metal layer 12 of the stamp 10 and the metal substrate 73.

Although not shown, after the substrate 71 is loaded into a sputtering chamber, a voltage may be applied to the metal layer 12 of the stamp 10 and a substrate support.

Figure 7C:
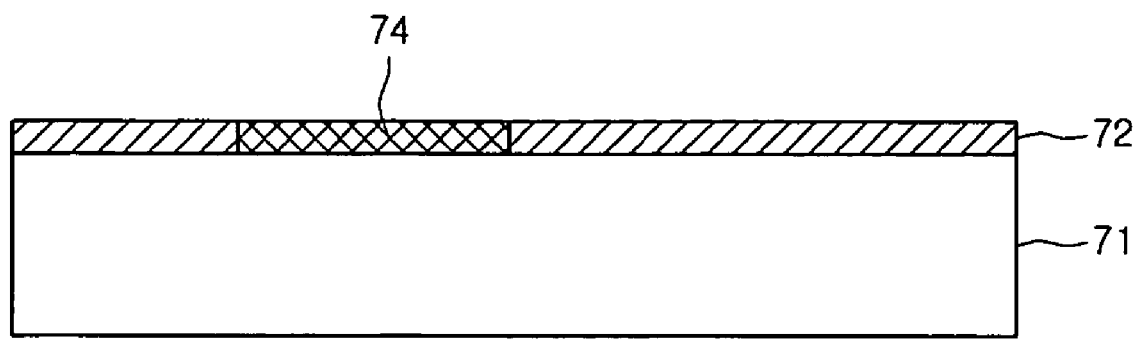

Referring to FIG. 7C, by detaching the stamp 10 from the charged layer 72, the charged zone 74 charged with negative (−) charges or positive (+) charges is formed in the contact region between the polymer layer 18 of the convex portion 16 of the stamp 10 and the charged layer 72.

Figure 7D:
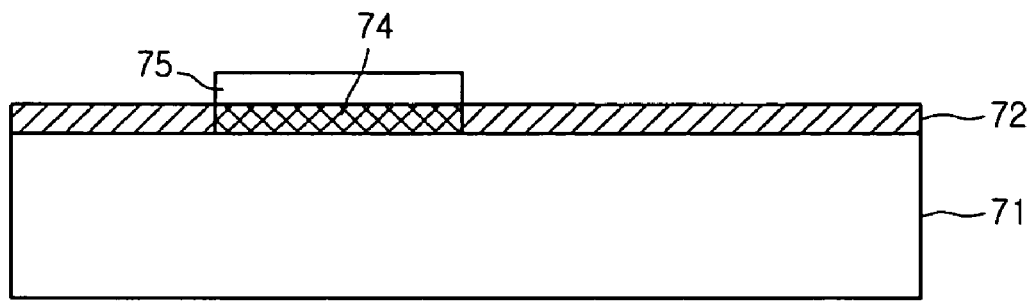

Referring to FIG. 7D, nano powder charged with opposite charges to those of the charged zone 74 is coated on the charged zone 74 using a printer toner method, or the substrate 71 with the charged zone 74 is soaked in a solution in which nano wire or nano tube charged with opposite charge to those of the charged zone 74 is dispersed. Thus, a semiconductor layer 75 is formed in a self-assembled monolayer (SAM) on the charged zone 74 due to the attractive force. At this point, the substrate 71 with the semiconductor layer 75 is taken out from the solution and dried using light or heat.

A conductive metal is stacked on an entire surface of the substrate 71 with the semiconductor layer 75. Then, using a mask, the conductive metal is patterned to form source and drain electrodes 76 and 77 on the charged layer 72. The source drain electrodes 76 and 77 are spaced apart from each other by a predetermined distance and connected to the semiconductor layer 75.

Figure 7E:
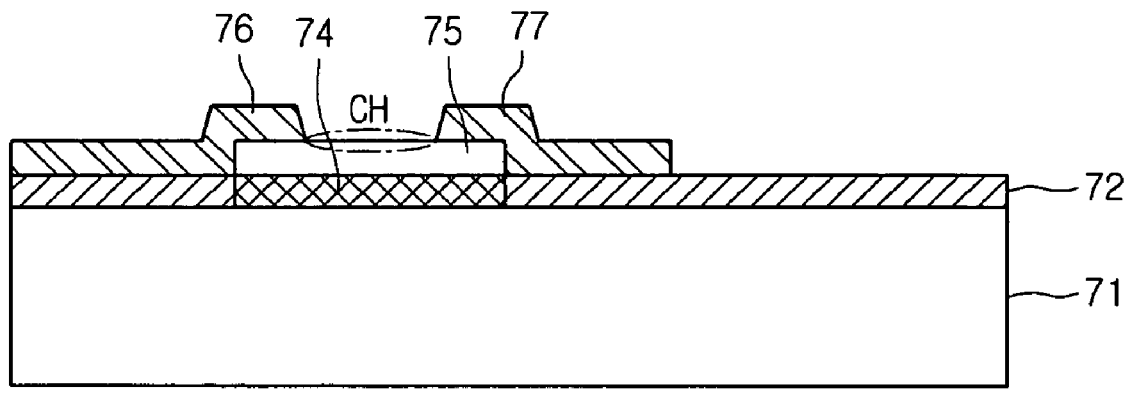

Referring to FIG. 7E, a channel CH is formed in a region where the source and drain electrodes 76 and 77 are spaced apart and the semiconductor layer 75 is exposed. The channel CH connects the source electrode 76 to the drain electrode 77.

Figure 7F:
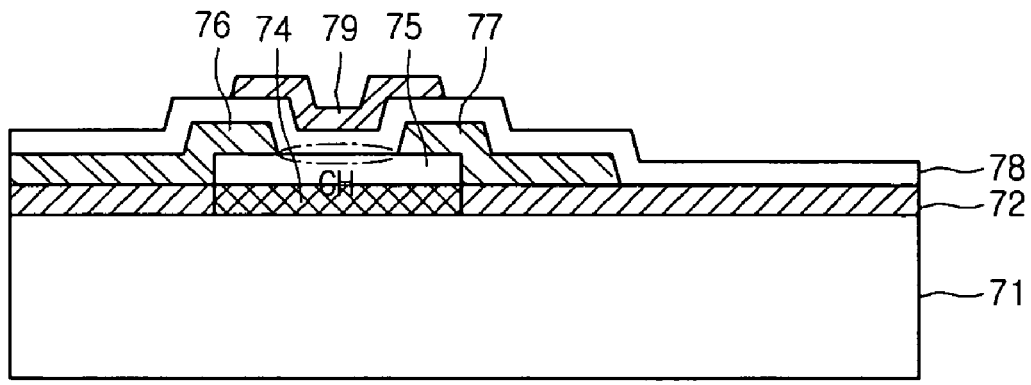

Referring to FIG. 7F, a gate insulating layer 78 is formed on an entire surface of the substrate 71 with the source and drain electrodes 76 and 77. The conductive metal is patterned to form a gate electrode 79 corresponding to the semiconductor layer 75.

The materials of the charged layer 72, the semiconductor layer 75, the source and drain electrodes 76 and 77, the gate insulating layer 78, and the gate electrode 79 and the forming method thereof are identical to those of the first embodiment of the present invention.

Through these procedures, a thin film transistor having the semiconductor layer 75, the source and drain electrodes 76 and 77, and the gate electrode 79 is completed.

Figure 7G:
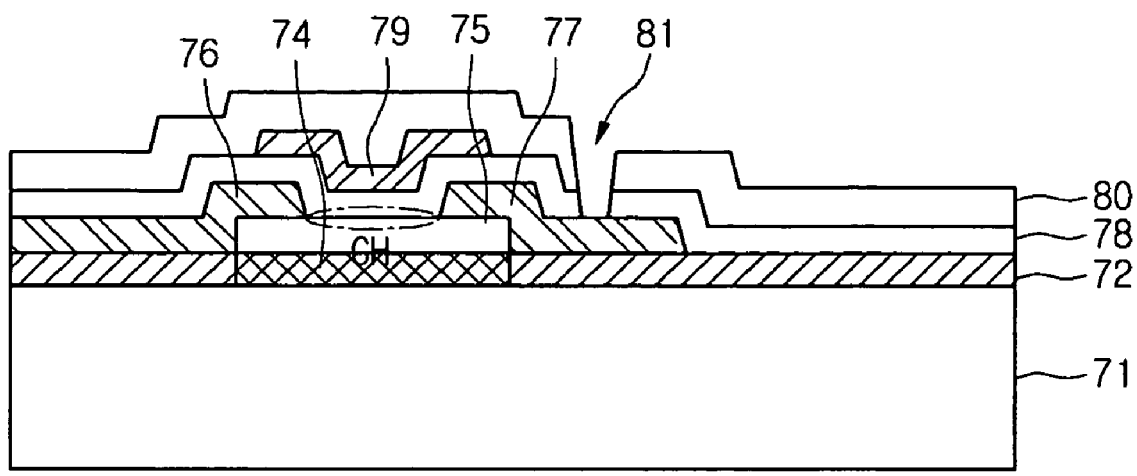

Referring to FIG. 7G, a passivation layer 80 is formed on an entire surface of the substrate 71 with the gate electrode 79. Then, the passivation layer 80 and the gate insulating layer 78 are dry or wet etched to form a contact hole 81 exposing a portion of the surface of the drain electrode 77. The passivation layer 80 may be deposited using silicon oxide layer or silicon nitride layer through PECVD or LPCVD.

Figure 7H:
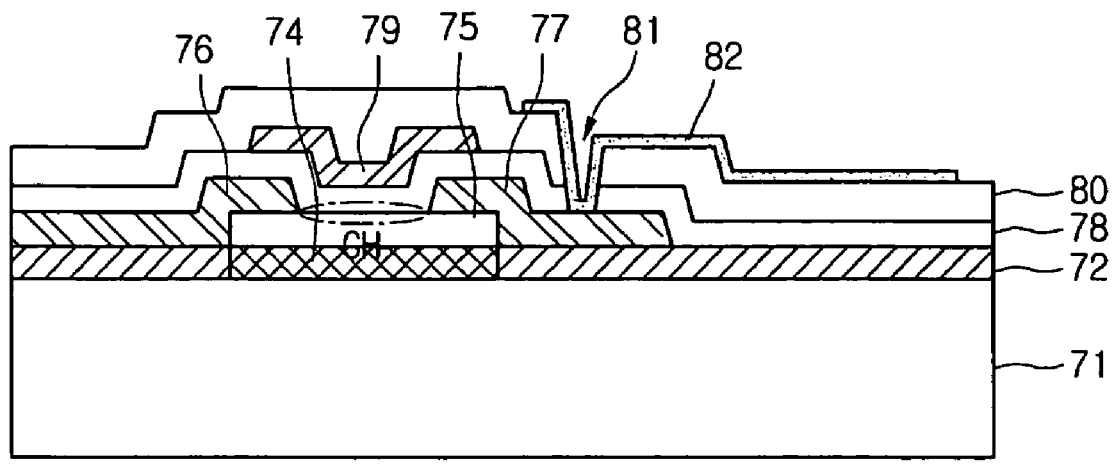

Referring to FIG. 7H, a transparent conductive material is formed on the passivation layer 80 with the contact hole 81 by sputtering and then patterned to form a pixel electrode 82 electrically connected with the drain electrode 77 through the contact hole 81. The transparent conductive material may be indium tin oxide (ITO) or indium zinc oxide (IZO).

Through these procedures, the array substrate of the LCD is completed using the method of fabricating the thin film transistor using the stamp according to the first embodiment of the present invention.

As described above, using the flexible stamp, the contact property between the large-sized substrate and the charged layer is improved, and the charged zone with the excellent patterning property can be formed within the charged layer through self-assembly. Consequently, the semiconductor layer can be formed in the excellent nano patterns equal to the desired semiconductor layer patterns during the initial deposition, thereby improving the performance of the device in the LCD.

For the sake of convenience, the above description has been made about the fabricating method of the LCD using the method of fabricating the thin film transistor according to the first embodiment of the present invention, but the LCD can also be fabricated using the method of fabricating the thin film transistor using the stamp according to the second and third embodiments of the present invention.

That is, in the LCD, any one of the semiconductor layer, the gate electrode, and the source and drain electrodes formed within the charged layer on the substrate can be formed using the method of fabricating the thin film transistor using the method of forming nano patterns using the stamp according to the present invention.

As described above, in order to prevent the performance of the device from being degraded due to the charged layer formed between the electrodes of the thin film transistor, the method of forming nano patterns using the charged layer is limited to any one of the semiconductor layer, the gate electrode, and the source and drain electrodes.

Although not shown, the array substrate is attached to a color filter substrate, including a black matrix, a color filter layer, and a common electrode, except an injection hole, by a sealant. A liquid crystal layer is formed by injecting liquid crystals between the array substrate and the color filter substrate through the injection hole. Through these procedures, the LCD is completed.

The present invention can improve the property of the desired charged zone on the substrate by improving the contact property between the charged zone and the substrate.

Also, the present invention can form the nano patterns equal to the desired shape during the initial deposition by forming the self-assembled monolayer using the stamp.

Further, the thin film transistor and the LCD can be fabricated by the method of forming the precise nano patterns using the stamp, thereby improving the performance of the device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming at least one of a semiconductor layer, a source electrode, a drain electrode, and a gate electrode in a thin film transistor on a substrate comprising:
    forming a charged layer on a substrate;
    forming a plurality of charged zones in a predetermined portion of the charged layer using a stamp,
        the stamp comprising:
        a base substrate,
        a metal layer having a plurality of convex portions on the base substrate, and
        a polymer layer formed on the metal layer along the contour of the convex portions of the metal layer,
        wherein the charged zones respectively correspond to the convex portions,
        wherein the convex portions covered by the polymer layer indirectly contact the charged zones through the polymer layer;
    forming patterns of self-assembled nano material directly on the charged zones,
    wherein the patterns of self-assembled nano material act as at least one of a semiconductor layer, a source electrode, a drain electrode, and a gate electrode in a thin film transistor,
    wherein the step of forming the charged zones in a predetermined portion of the charged layer comprises:
        directly contacting the polymer layer with the charged layer;
        applying a predetermined voltage between the metal layer and the substrate; and
        detaching the stamp from the substrate.

2. The method according to claim 1, wherein the patterns comprises nano patterns.

3. The method according to claim 1, wherein the nano material is charged with opposite charges to those of the charged zones.

4. The method according to claim 1, wherein the step of forming patterns of self-assembled nano material in the charged zones comprises:
    self-assembling nano material, charged with opposite charges to those of the charged zones, on the patterns.

5. The method according to claim 1, wherein the charged layer comprises PolyDiMethylSiloxane (PDMS) or Poly Methyl Meta Acrylate (PMMA).

6. The method according to claim 1, wherein the charged layer is formed using one of spin coating, slit coating, spray deposition, and Langmuir Blodgett method.

7. The method according to claim 1, wherein the nano material is selected from the group consisting of nano powder, nano wire, and nano tube.

8. The method according to claim 1, wherein the nano material is selected from the group consisting of silicon (Si), gold (Au), silver (Ag), and copper (Cu).

9. The method according to claim 1, wherein the patterns are coated using a print toner method.

10. The method according to claim 1, wherein the patterns are formed by a plating process by soaking the substrate in a solution in which nano materials are dispersed.

11. The method according to claim 1, wherein the substrate is conductive or non-conductive.

12. The method according to claim 1, wherein the nano patterns are dried using ultraviolet light.

13. A method of forming at least one of a semiconductor layer, a source electrode, a drain electrode, and a gate electrode in a thin film transistor on a substrate comprising:
forming a charged layer on the substrate;
forming a plurality of charged zones in a predetermined portion of the charged layer using a stamp,
the stamp comprising:
a base substrate,
a metal layer having a plurality of convex portions on the base substrate, and
a polymer layer formed on the metal layer along the contour of the convex portions on the metal layer,
wherein the charged zones respectively correspond to the convex portions,
wherein the convex portions covered by the polymer layer indirectly contact with the charged zones through the polymer layer;
forming the semiconductor layer by self-assembling nano material on the charged zones,
wherein the semiconductor layer is formed of one of nano powder, nano wire, and nano tube;
forming source and drain electrodes which are spaced apart from each other by a predetermined distance and connected to the semiconductor layer;
forming a gate insulating layer on the substrate;
forming the gate electrode on the gate insulating corresponding to the semiconductor layer,
wherein the step of forming the charged zones in a predetermined portion of the charged layer comprises:
directly contacting the polymer layer with the charged layer;
applying a predetermined voltage between the metal layer and the substrate; and
detaching the stamp from the substrate.

14. A method of forming at least one of a semiconductor layer, a source electrode, a drain electrode, and a gate electrode in a thin film transistor on a substrate comprising:
forming a charged layer on the substrate;
forming a plurality of charged zones in a predetermined portion of the charged layer using a stamp,
the stamp comprising:
a base substrate,
a metal layer having a plurality of convex portions on the base substrate, and
a polymer layer formed on the metal layer along the contour of the convex portions on the metal layer,
wherein the charged zones respectively correspond to the convex portions,
wherein the convex portions covered by the polymer layer indirectly contact with the charged zones through the polymer layer;
forming the gate electrode by self-assembling nano material on the charged zones,
wherein the gate electrode is formed of one of nano powder, nano wire, and nano tube;
forming a gate insulating layer on an entire surface of the substrate with the gate electrode;
forming the semiconductor layer in a region corresponding to the gate electrode;
forming source and drain electrodes which are spaced apart from each other by a predetermined distance and connected to the semiconductor layer,
wherein the step of forming the charged zones in a predetermined portion of the charged layer comprises:
directly contacting the polymer layer with the charged layer;
applying a predetermined voltage between the metal layer and the substrate; and
detaching the stamp from the substrate.

15. A method of forming at least one of a semiconductor layer, a source electrode, a drain electrode, and a gate electrode in a thin film transistor on a substrate comprising:
forming a charged layer on the substrate;
forming a plurality of charged zones in a predetermined portion of the charged layer using a stamp,
the stamp comprising:
a base substrate,
a metal layer having a plurality of convex portions on the base substrate, and
a polymer layer formed on the metal layer along the contour of the convex portions on the metal layer,
wherein the charged zones respectively correspond to the convex portions,
wherein the convex portions covered by the polymer layer indirectly contact with the charged zones through the polymer layer;
forming the source and drain electrodes which are spaced apart from each other by self-assembling nano material on the charged zones,
wherein the source and drain electrodes are formed of one of nano powder, nano wire, and nano tube;
forming the semiconductor layer which is connected to the source and drain electrodes between the electrodes;
forming a gate insulating layer on the surface;
forming the gate electrode on the gate insulating corresponding to the semiconductor layer,
wherein the step of forming the charged zones in a predetermined portion of the charged layer comprises:
directly contacting the polymer layer with the charged layer;
applying a predetermined voltage between the metal layer and the substrate; and
detaching the stamp from the substrate.

* * * * *